United States Patent [19]

Stepan

[11] Patent Number: 4,629,267
[45] Date of Patent: Dec. 16, 1986

[54] CIRCUIT TERMINATING DEVICE

[75] Inventor: William E. Stepan, Clarendon Hills, Ill.

[73] Assignee: GTE Communication Systems Corporation, Phoenix, Ariz.

[21] Appl. No.: 856,862

[22] Filed: Apr. 25, 1986

Related U.S. Application Data

[63] Continuation of Ser. No. 660,346, Oct. 12, 1984, abandoned.

[51] Int. Cl.⁴ .............................................. H01R 9/09
[52] U.S. Cl. .............................. 339/17 M; 339/258 R
[58] Field of Search .......... 339/17 M, 17 LC, 17 LM, 339/17 C, 17 CF, 17 N, 17 L, 258 R, 258 P; 361/393, 412–414

[56] References Cited

U.S. PATENT DOCUMENTS 3,270,251  8/1966  Evans .............................. 339/17 LM
3,287,686  11/1966 Ruehlemann ................. 339/17 LM
3,805,117  4/1974  Hausman ............................. 361/412
4,025,162  5/1977  Yagi .................................. 339/17 M Primary Examiner—Neil Abrams
Attorney, Agent, or Firm—Anthony Miologos; Peter Xiarhos

[57] ABSTRACT

A circuit terminating device for mechanically retaining and electrically connecting a planar substrate such as a thick/thin film circuit to a printed wiring card. The terminating device is characterized by a terminating body having planar sidewalls defining a hollow interconnection post receiving area therebetween. A pair of substrate spring members extend from a sidewall of the terminating body arranged to compressively accept an edge of the substrate retaining and connecting the substrate to the terminating body. Post spring members extending inwardly into the post receiving area engage an interconnection post which extends from the printed wiring card thereby retaining the terminating body to the printed wiring card.

4 Claims, 3 Drawing Figures

CIRCUIT TERMINATING DEVICE

This is a continuation of co-pending application Ser. No. 660,346 filed on Oct. 12, 1984, now abandoned.

CROSS-REFERENCE TO RELATED APPLICATIONS

The present application is related to co-pending U.S. patent application Ser. No. 660,348 titled "A Circuit to Post Interconnection Device" and U.S. patent application Ser. No. 660,347 titled "A Circuit Terminating Clip", both having the same inventive entity and being assigned to the same assignee.

BACKGROUND OF THE INVENTION

This invention relates in general to electrical interconnection devices and more particularly to a device for providing electrical connections between planer circuits such as thick/thin film hybrid circuits and printed wiring cards.

Typically, electrical connections to thick/thin film hybrid circuits are made through wires or terminal devices. These terminal devices are soldered onto a hybrid circuits edge with an opposite end plugged into a socket or more likely, into holes in a printed wiring card (PWC). When inserted into PWC hole, the connections are soldered to insure good mechanical and electrical connections. This method finds disadvantage in that the replacement of defective hybrid circuits is obviously difficult and sometimes damaging to the entire PWC assembly.

Still another method of making such interconnections is the use of sockets on the PWC which accept hybrid terminal devices as a plug in module. This method also finds disadvantage in that it adds significantly to the cost of the assembly. Further, the hybrid terminals are usually not designed as pluggable contacts and can become damaged through careless insertion. Finally, the possibility exists that the socket receptacles on the PWC can become damaged making the entire PWC assembly unusable.

It has become increasingly popular in the industry in recent years to use squae or rectangular metallic posts as an interconnection member. Such posts are pressed into holes in a PWC, with the electrical connection between the posts and the PWC made by either intimate contact or with the aid of a solder connection. Various means can be used to interconnect one PWC to another or a PWC to a thick/thin film hybrid circuit. There interconnection means can range from the use of receptacles made for this purpose or the use of wire wrapping.

Presently known receptacles require one or more holes in the substrate for attachment. This finds disadvantage however in thick/thin film hybrids since they are usually made out of a ceramic substrate and usually are economically impractical to include holes.

Accordingly, it is the object of the present invention to provide a circuit terminating device for interconnecting planer circuits such as thick/thin film hybrid circuits to a PWC in an effective and economical manner.

SUMMARY OF THE INVENTION

In accomplishing the object of the present invention there is provided a circuit terminating device for mechanically retaining and electrically connecting a planer substrate to a printed wiring card. The planer substrate includes at least a first termination pad located adjacent one edge of the substrate. A printed wiring card includes at least one interconnection post extending vertically from a top surface of a printed wiring card.

The device of the present invention is characterized by a generally rectangular terminating body having a pair of planer sidewalls and a planer front and rear wall defining a hollow interconnection post receiving areas therebetween. Each of the sidewalls includes a post spring member which extends inwardly into the post receiving area. The post receiving area is arranged to accept substantially therein the printed wiring card interconnection post. Each post spring member engages and exerts a compressive force on the interconnection post, mechanically retaining and electrically connecting the terminating body to the interconnection post.

A pair of S-shaped substrate spring members each extend from a top and bottom edge respectively of the front wall of the terminating device. Each of the substrate spring members include a contact surface directly opposite of the other providing a substrate accepting area arranged to compressively accept an edge of the substrate therebetween, mechanically retaining the substrate to the terminating body. At least one of the contact surfaces engages the first termination pad electrically connecting the substrate to the terminating body.

The substrate may further include a second termination pad on a side opposite the first termination pad arranged to engage the other contact surface providing a second electrical connection between the substrate and the terminating body. Solder may be applied between each contact surface and first and second terminatng pads to fixedly retain the circuit terminating device to the substrate.

DESCRIPTION OF THE PREFERRED EMBODIMENT

Figure 1:
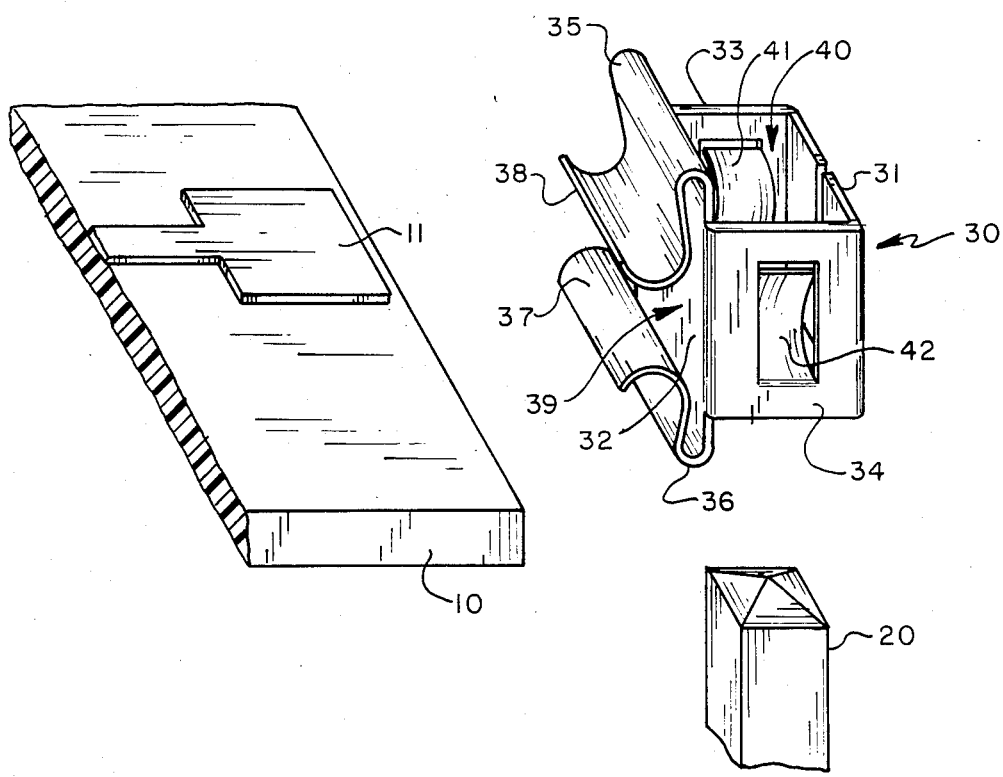
FIG. 1 is a perspective view of the device of the present invention.

Turning now to FIG. 1, the present invention is characterized by a rectangular terminating body shown generally as 30 and having a vertical back wall 31, front wall 32, and sidewalls 33 and 34. Walls 31-34 define an interconnection post receiving area 40, extending through body 30, arranged to accept a square interconnection post 20 therein. Post spring members 41 and 42 extend inward into receiving area 40 and exert a compressive force on interconnection post 20, providing a compressive fit of terminating body 30 on post 20.

A pair of S-shaped substrate spring members 35 and 36 extend outward at the top and bottom edges respectively of front wall 32. Surfaces 38 and 37 of substrate spring members 35 and 36 respectively, define a substrate accepting area 39 therebetween arranged to accept an edge of a planer substrate 10. A metallic termination pad 11 on substrate 10 has a compressive force applied to it by surfaces 38 and 37 providing an intimate mechanical connection as well as an electrical connection between substrate 10 and body 30. A second metallic pad opposite pad 11 may also be included on substrate 10 with ech surface 38 and 37 fixedly attached to its respective pad by the application of solder.

The circuit terminating device of the present invention is stamped out of and formed from a phosphor bronze material exhibiting good conductive qualities.

Figure 2:
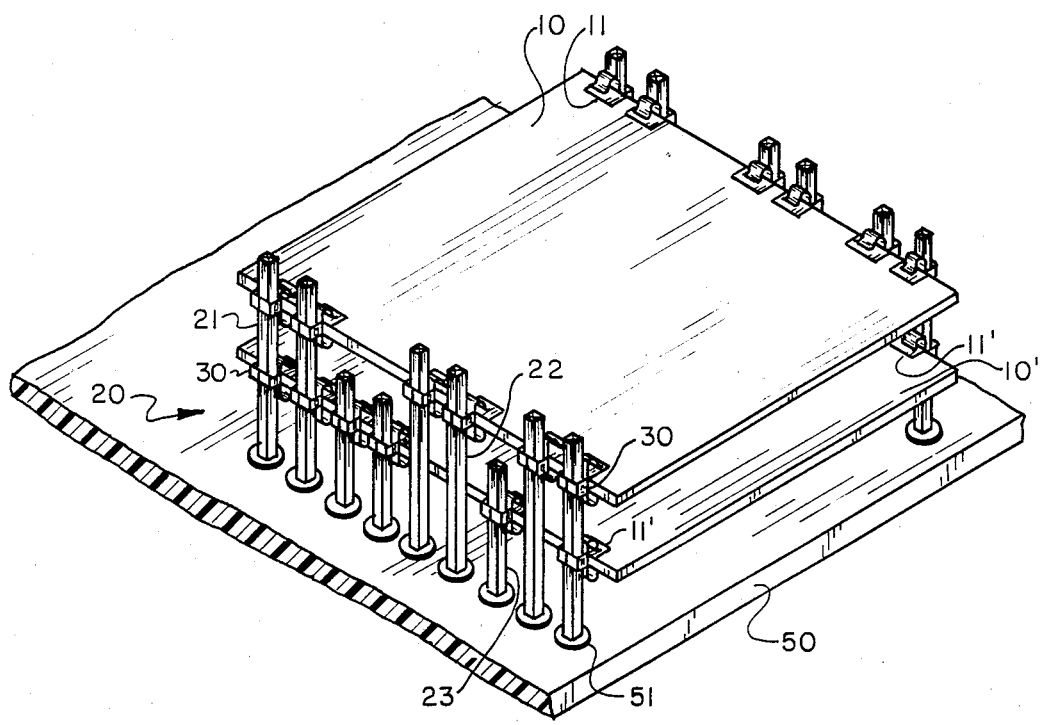
FIG. 2 is a perspective view illustrating the use of the device of the present invention for interconnecting two substrates to a PWC.

Turning now to FIG. 2, an example of the intended use of the device of the present invention is illustrated. As can be seen a printed wiring card (PWC) 50 has a plurality of interconnection posts 20 affixed to the PWC 50 by soldering posts 20 to holes 51. As can be seen in the example, two planer substrates 10 and 10' are mounted to the PWC in a parallel fashion. The planer substrates 10 and 10' can be thick/thin film hybrid cicuits or other printed wiring devices. The devices of the present invention as explained earlier are fixed on to the termination pads on each substrate 10, 10' and each body 30 attached by mating a respective post 20 into post receiving area 40. The posts can further be grouped into common or signal specific terminals. For example posts 21 provide common signals from the PWC to both substrates 10 and 10'. Specific signals from the PWC to each substrate 10, 10' may be accomplished by post 22 which provides signals from the PWC to substrate 10 or post 23 which provides signals to substrate 10'.

It will be understood by those skilled in the art that any number of substrates may be stacked in a parallel fashion as shown, with the only limitation being the height of the terminal post.

Figure 3:
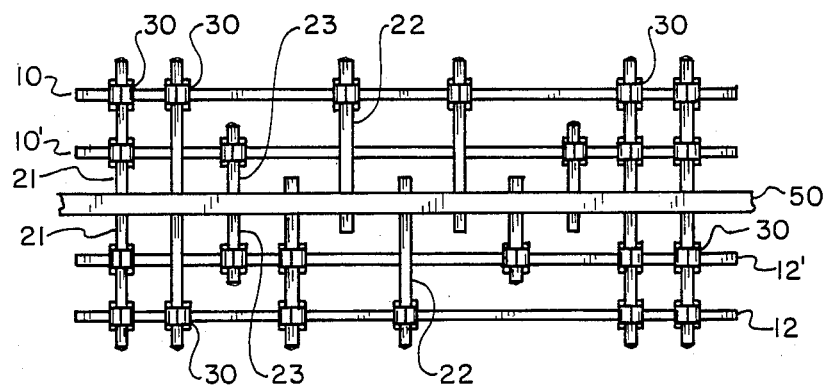
FIG. 3 is an elevational view illustrating the use of the device of the present invention for interconnecting a plurality of substrates on both sides of a PWC.

Turning now to FIG. 3 a second example of a way in which the present invention may be used to advantage is illustrated. Basically the second example is similar to the first example shown on FIG. 2 with the exception that the posts also extend from the bottom of PWC 50 and connect to additional substrates 12 and 12'. Substrates 12 and 12' are interconnected via body 30 and post 21 for common connections, post 23 for substrate 12' connections and post 22 for the substrate 12 connections.

It will be appreciated by those skilled in the art that the present invention has advantages in the mounting of thick/thin film hybrid circuits to printed wiring boards over the prior art devices. These advantages include the replacing of defective hybrid circuits and the placing of the hybrids over existing components on a PWC without making those components inaccessible if replacement is necessary.

Although the preferred embodiment of the invention has been illustrated, and that form described in detail, it will be readily apparent to those skilled in the art that various modifications may be made therein without departing from the spirit of the invention or from the scope of the appended claims.

What is claimed is:

1. A circuit terminating device for mechanically retaining and electrically connecting a thick/thin film circuit to a printed wiring card, said thick/thin film circuit including at least a first termination pad located adjacent one edge of said thick/thin film circuit, and said printed wiring card including at least one interconnection post extending perpendicularly from a top surface of said printed wiring card, said circuit terminating device comprising:

a generally rectangular terminating body having a pair of planar sidewalls and a planar front and rear wall defining a hollow interconnection post receiving area therebetween, each of said sidewalls including a post spring member extending inwardly from a respective sidewall into said post receiving area, and said post receiving area arranged to accept substantially therein said interconnection post with each post spring member engaging and exerting a compressive force to respective and opposite sides of said interconnection post, mechanically retaining and electrically connecting said terminating body to said interconnection post;

a first substrate spring member including a first planar section extending from a top edge of said front wall and a second planar section oriented parallel to said front wall, said first and second sections joined by a first radial section, said first substrate spring member further including a second substantially larger radial section extending from said second section and said second radial section including a contact surface;

a second substrate spring member including a first planar section extending from a bottom edge of said front wall and a second planar section oriented parallel to said front wall, said first and second sections joined by a first radial section, said first substrate spring member further including a second substantially larger radial section extending from said second section and said second radial section including a contact surface located directly opposite of said first substrate spring member contact surface defining a substrate accepting area, said substrate accepting area arranged to compressively accept an edge of said substrate mechanically retaining said substrate to said terminating body, with one of said contact surfaces engaging said first termination pad electrically connecting said substrate to said terminating body.

2. The circuit terminating device as claimed in claim 1, wherein: said substrate further includes a second termination pad on a side opposite said first termination pad, arranged to engage the other of said contact surfaces electrically connecting said substrate to said terminating body.

3. A circuit terminating device as claimed in claim 1, wherein: said circuit terminating device is formed as a one-piece unit from an electrically conductive material.

4. A circuit terminating device as claimed in claim 2, wherein: said terminating body is fixedly retained to said substrate by the application of solder to each of said second contact surfaces and said first and second termination pads respectively.

* * * * *